(12) United States Patent
Batra et al.

(10) Patent No.: US 10,811,873 B2
(45) Date of Patent: Oct. 20, 2020

(54) POWER SUPPLY CLAMP FOR ELECTROSTATIC DISCHARGE (ESD) PROTECTION HAVING A CIRCUIT FOR CONTROLLING CLAMP TIME OUT BEHAVIOR

(71) Applicant: STMicroelectronics International N.V., Schiphol (NL)

(72) Inventors: Vicky Batra, New Delhi (IN); Radhakrishnan Sithanandam, Greater Noida (IN)

(73) Assignee: STMicroelectronics International N.V., Schiphol (NL)

(*) Notice: Subject to any disclaimer, the term of this patent is extended or adjusted under 35 U.S.C. 154(b) by 372 days.

(21) Appl. No.: 15/823,863

(22) Filed: Nov. 28, 2017

(65) Prior Publication Data
US 2019/0165571 A1  May 30, 2019

(51) Int. Cl.
| | | |
|---|---|---|
| H02H 9/04 | (2006.01) | |
| H01L 27/02 | (2006.01) | |
| H01L 27/06 | (2006.01) | |
| H01L 23/528 | (2006.01) | |
| H02H 9/00 | (2006.01) | |
| H01L 27/04 | (2006.01) | |
| H02H 3/22 | (2006.01) | |

(52) U.S. Cl.
CPC ........ *H02H 9/046* (2013.01); *H01L 27/0255* (2013.01); *H01L 27/0266* (2013.01); *H01L 27/0285* (2013.01); *H01L 27/0288* (2013.01); *H01L 27/0629* (2013.01); *H01L 23/5286* (2013.01); *H01L 27/04* (2013.01); *H01L 27/06* (2013.01); *H02H 3/22* (2013.01); *H02H 9/00* (2013.01); *H02H 9/04* (2013.01)

(58) Field of Classification Search
USPC ........................................... 361/56, 91.1, 111
See application file for complete search history.

(56) References Cited

U.S. PATENT DOCUMENTS

| | | | |
|---|---|---|---|
| 6,919,602 B2* | 7/2005 | Lin ..................... | H01L 27/0266 257/355 |
| 7,944,271 B2 | 5/2011 | Illegems | |
| 2004/0109270 A1* | 6/2004 | Stockinger .......... | H01L 27/0251 361/56 |
| 2014/0168831 A1* | 6/2014 | Watanabe ............. | H02H 9/046 361/56 |

* cited by examiner

*Primary Examiner* — Danny Nguyen
(74) *Attorney, Agent, or Firm* — Crowe & Dunlevy

(57) ABSTRACT

Electrostatic discharge (ESD) protection is provided in using a supply clamp circuit formed by an ESD event actuated transistor device. A bias current is generated in response to operation of a voltage independent current generator circuit. The bias current is sourced to ensure that the transistor device is deactuated after the ESD event is dissipated.

31 Claims, 1 Drawing Sheet

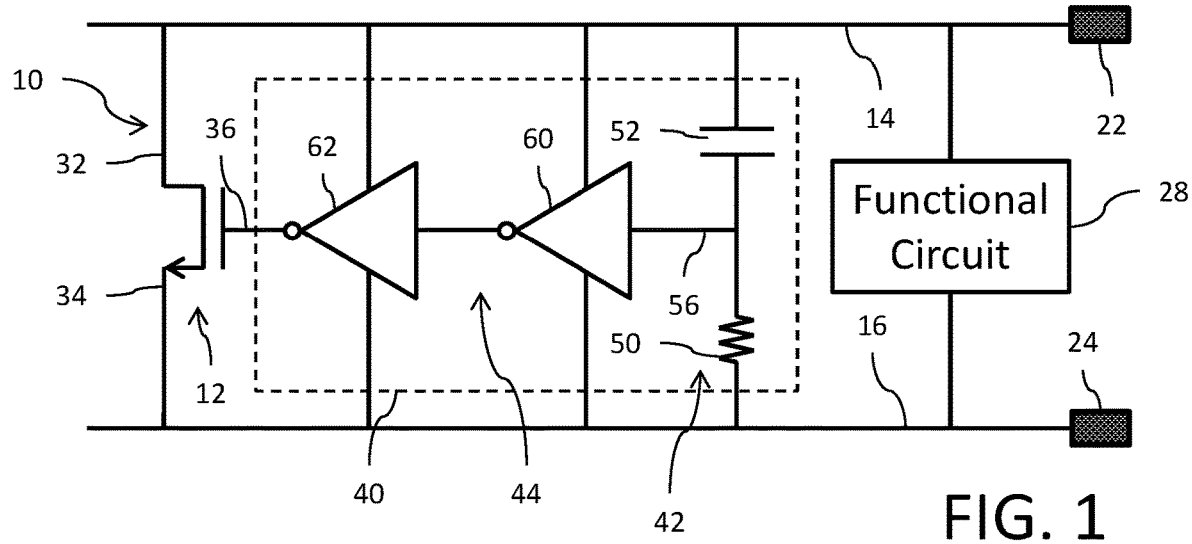
FIG. 1 (Prior Art)
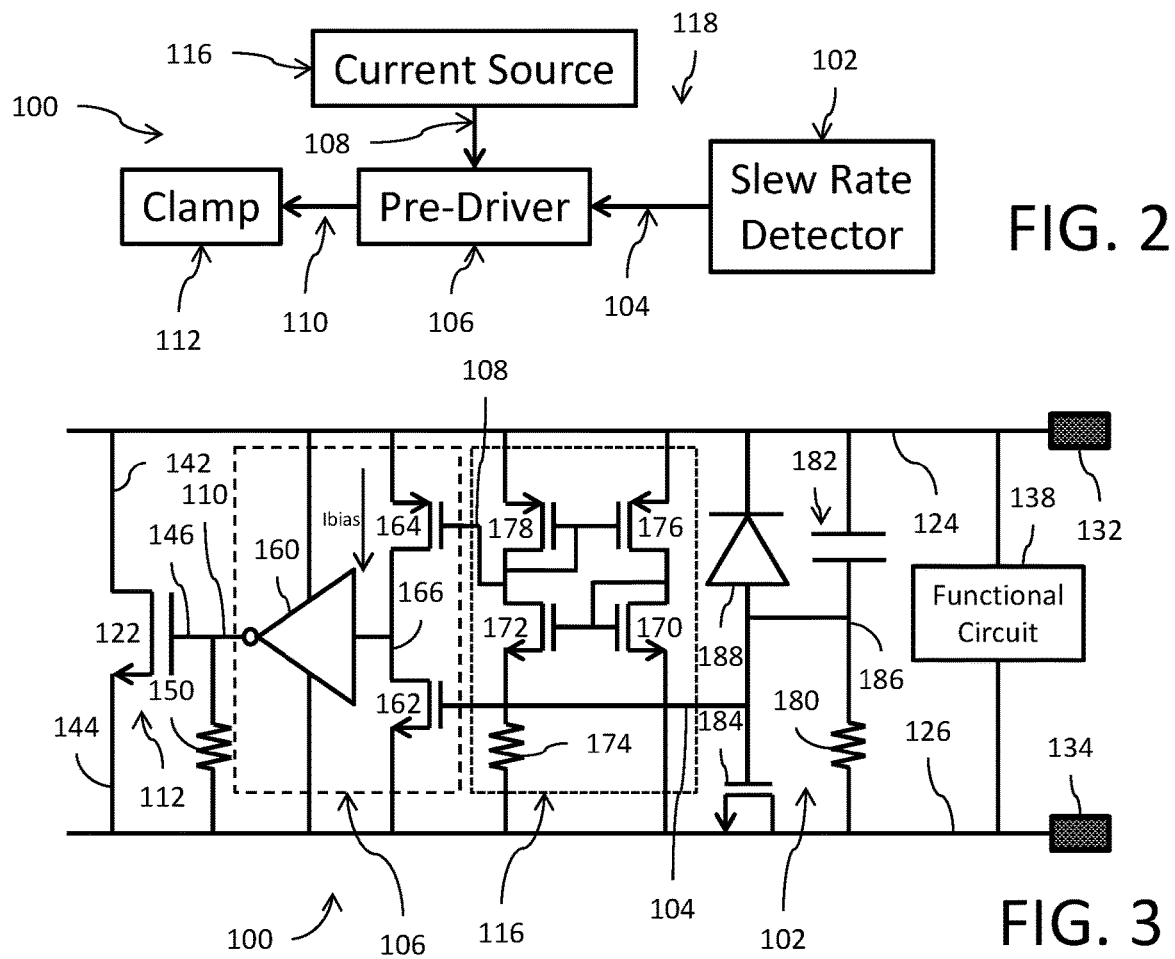
FIG. 2
FIG. 3

POWER SUPPLY CLAMP FOR ELECTROSTATIC DISCHARGE (ESD) PROTECTION HAVING A CIRCUIT FOR CONTROLLING CLAMP TIME OUT BEHAVIOR

TECHNICAL FIELD

The present invention relates to a device for protecting an integrated circuit against overvoltages and, in particular, against electrostatic discharges.

BACKGROUND

FIG. 1 shows a circuit diagram for a conventional power supply clamp circuit 10 for electrostatic discharge (ESD) protection in an integrated circuit. The supply clamp circuit 10 is formed by a transistor switching circuit 12 coupled between a first supply line 14 of the integrated circuit and a second supply line 16 of the integrated circuit. The first supply line 14 is coupled to a positive power supply pad 22 for the integrated circuit and the second supply line 16 is coupled to a negative or ground power supply pad 24 for the integrated circuit. The functional circuit 28 to be protected is also coupled between the first supply line 14 and the second supply line 16. The transistor switching circuit 12 has a first conduction terminal 32 coupled to the first supply line 14 and a second conduction terminal 34 coupled to the second supply line 16. A control terminal 36 of the transistor switching circuit 12 receives a trigger signal generated by a trigger circuit 40 that senses a transient voltage difference in the first or second supply lines 14 and 16, respectively, and fires to assert the trigger signal in response to the sensed difference. In an embodiment, the transistor switching circuit 12 comprises an n-channel MOSFET device with the first conduction terminal 32 being the drain terminal, the second conduction terminal 34 being the source terminal and the control terminal 36 being the gate terminal. The trigger circuit 40 comprises an ESD detection circuit 42 and a trigger signal conditioning circuit 44. The ESD detection circuit 42, also known in the art as slew rate detector circuit, is formed by a resistive-capacitive (RC) circuit comprising a resistor 50 connected in series with a capacitor 52 between the first and second supply lines 14 and 16. A first terminal of the resistor 50 is connected to the second supply line 16 and a second terminal of the resistor 50 is connected to node 56. A first plate of the capacitor 52 is connected to node 56 and a second plate of the capacitor 52 is connected to the first supply line 14. The trigger signal conditioning circuit 44, also known in the art as a pre-driver circuit, comprises first and second inverter circuits 60 and 62, respectively, connected in series with each other. The inverter circuits 60 and 62 are powered from the first and second supply lines 14 and 16, with an input of the inverter circuit 60 connected to node 56, an output of inverter circuit 60 connected to an input of inverter circuit 62 and an output of inverter circuit 60 connected to the control terminal 36 of the transistor switching circuit 12.

The ESD detection circuit 42 is designed to assert the trigger signal at node 56 in response to detection of a slew rate change at the first or second supply lines 14 and 16, respectively, that is faster than some critical value (for example, that is typical of an ESD event, this value referred to in the art as a target ESD detection limit). Otherwise, the trigger signal is not asserted. In response to the assertion of the trigger signal, the transistor switching circuit 12 is actuated (this is referred to as "time on"). It is important to subsequently deactuate the transistor switching circuit 12, for example, after a short period of time on the order of a microsecond (this is referred to as "time out"). There is a need in the art for the power supply clamp circuit to include a circuit which functions to control time out of the clamp. In this regard, time out needs to be delayed sufficiently to ensure that the ESD event is discharged, but the delay cannot be excessive. At the same time, time out must be certain so as to ensure that the transistor switching circuit 12 is fully turned off.

As an example, the following operational parameters for a power supply clamp are desirable: a) trigger speed: turn on time less than 200-300 ps; b) ESD rise time detection limit: 60 ns target, wherein rise times (slew rates) less than 60 ns are indicative of an ESD event and the transistor switching circuit should fully turn on, and wherein rise times greater than 60 ns are part of normal operation and the transistor switching circuit should remain off, and wherein normal input/output ringing and normal power up at a pad should not trigger a turn on; and c) hold time: the transistor switching circuit, once triggered at turn on should remain fully on for the duration of the ESD event, and after a certain hold time the transistor switching circuit should be fully turned off to prevent clamp leakage.

SUMMARY

In an embodiment, an electrostatic discharge (ESD) protection circuit comprises: a first power supply line; a second power supply line; a switching circuit having a first conduction terminal connected to the first power supply line, a second conduction terminal connected to the second power supply line and a gate control terminal; a trigger circuit for asserting, in response to detection of an ESD event at one or more of the first and second power supply lines, a trigger signal at the gate terminal of the switching circuit; and a voltage independent current generator circuit powered from the first and second power supply lines to generate a bias current that controls deasserting of the trigger signal.

In an embodiment, an electrostatic discharge (ESD) protection circuit comprises: a first power supply line; a second power supply line; a switching circuit having a first conduction terminal connected to the first power supply line, a second conduction terminal connected to the second power supply line and a gate control terminal; an inverter circuit having an output connected to the gate control terminal of the switching circuit; a first transistor having a source-drain path connected between a input of the inverter circuit and the second power supply line and a control gate coupled to receive an ESD detection signal; a second transistor having a source-drain path connected between the input of the inverter circuit and the first power supply line and a control gate coupled to receive a bias current control signal; an ESD detection circuit configured to assert the ESD detection signal in response to detection of an ESD event; and a voltage independent current generator circuit powered from the first and second power supply lines and configured to generate the bias current control signal.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings:

FIG. 1 shows a circuit diagram for a conventional power supply clamp circuit for electrostatic discharge (ESD) protection;

FIG. 2 is a block diagram of a power supply clamp circuit; and

FIG. 3 is a circuit diagram for the power supply clamp circuit of FIG. 2.

DETAILED DESCRIPTION

Reference is now made to FIG. 2 showing a block diagram of a power supply clamp circuit 100. The circuit 100 includes a slew rate detector circuit 102 that functions in this implementation as an ESD detection circuit for detecting an ESD event occurring at or between pads of an integrated circuit. The slew rate detector circuit 102 generates an ESD detection signal 104 in response to a voltage change at the integrated circuit pads in excess of a certain slew rate (that voltage change due, for example, to occurrence of an ESD event). The circuit 100 further includes a pre-driver circuit 106 having a first input that receives the ESD detection signal 104 and a second input that receives a bias current control signal 108. The pre-driver circuit 106 functions to condition the ESD detection signal 104 and output a drive (trigger) signal 110. The slew rate detector circuit 102 and pre-driver circuit 106 together form a trigger circuit 118 that controls actuation and deactuation of a clamp circuit 112. The clamp circuit 112 is actuated in response to assertion of the drive signal 110 to clamp between pads of the integrated circuit, and deactuated in response to deassertion of the drive signal 110. The bias current control signal 108 is generated by a supply independent current source circuit 116 and sourced to ensure that the clamp circuit 112 is deactuated following dissipation of the ESD event.

FIG. 3 shows a circuit diagram for the power supply clamp circuit 100 of FIG. 2.

The clamp circuit 112 comprises a transistor switching circuit 122 coupled between a first supply line 124 of the integrated circuit and a second supply line 126 of the integrated circuit. The first supply line 124 is coupled to a positive power supply pad 132 for the integrated circuit and the second supply line 126 is coupled to a negative or ground power supply pad 134 for the integrated circuit. The functional circuit 138 to be protected is also coupled between the first supply line 124 and the second supply line 126. The transistor switching circuit 122 has a first conduction terminal 142 coupled to the first supply line 124 and a second conduction terminal 144 coupled to the second supply line 126. A control terminal 146 of the transistor switching circuit 122 receives the drive signal 110. In an embodiment, the transistor switching circuit 122 comprises an n-channel MOSFET device with the first conduction terminal 142 being the drain terminal, the second conduction terminal 144 being the source terminal and the control terminal 146 being the gate terminal. A resistor 150 has a first terminal connected to the control terminal 146 and a second terminal connected to the second supply line 126.

The pre-driver circuit 106 includes an inverter circuit 160 powered from the first and second supply lines 124 and 126. An output of the inverter circuit 160 is connected to the control terminal 146 of the transistor switching circuit 122 and generates the drive signal 110. An n-channel MOSFET device 162 has a drain terminal connected to the input 166 of the inverter circuit 160 and a source terminal connected to the second supply line 126 (i.e., the source-drain path of n-channel MOSFET device 162 is connected between input 166 and line 126). The gate terminal of the n-channel MOSFET device 162 provides the first input of the pre-driver circuit 106 receiving the ESD detection signal 104. A p-channel MOSFET device 164 has a drain terminal connected to the input 166 of the inverter circuit 160 and a source terminal connected to the first supply line 124 (i.e., the source-drain path of p-channel MOSFET device 164 is connected between input 166 and line 124). The gate terminal of the p-channel MOSFET device 164 provides the second input of the pre-driver circuit 106 receiving the bias current control signal 108, and the drain terminal of the p-channel MOSFET device 164 sources a bias current Ibias to the input 166 of the inverter circuit 160.

The supply independent current source circuit 116 is a proportional to absolute temperature (PTAT) CMOS current source that is independent of supply voltage. A first n-channel MOSFET device 170 has a source terminal connected to the second supply line 126. A second n-channel MOSFET device 172 has a source terminal connected to the second supply line 126 via a resistor 174. The gate terminals of the first and second n-channel MOSFET devices 170 and 172 are connected to each other and to the drain terminal of the first n-channel MOSFET device 170. A first p-channel MOSFET device 176 has a source terminal connected to the first supply line 124 and a drain terminal connected to the drain terminal of the first n-channel MOSFET device 170. A second p-channel MOSFET device 178 has a source terminal connected to the first supply line 124 and a drain terminal connected to the drain terminal of the second n-channel MOSFET device 172. The gate terminals of the first and second p-channel MOSFET devices 176 and 178 are connected to each other and to the drain terminal of the second p-channel MOSFET device 178. Operation of the PTAT CMOS current source is well known to those skilled in the art (see, for example, U.S. Pat. No. 7,944,271, incorporated by reference, FIG. 2 and description).

The gate terminal of the p-channel MOSFET device 164 in the pre-driver circuit 106 is connected to the gate terminals of the first and second p-channel MOSFET devices 176 and 178 in a current mirroring circuit configuration. Thus, the PTAT current generated by the supply independent current source circuit 116 is mirrored by the p-channel MOSFET device 164 to provide the bias current Ibias.

In an alternative implementation, the supply independent current source circuit 116 may comprise a bandgap-type current generator circuit. The circuit configuration of such a current generator circuit is known to those skilled in the art. The gate terminal of the p-channel MOSFET device 164 in the pre-driver circuit 106 is similarly connected to a current mirror node of the bandgap-type current generator circuit.

The slew rate detector circuit 102 includes a resistive-capacitive (RC) circuit comprising a resistor 180 connected in series with a capacitor 182 between the first and second supply lines 124 and 126. A first terminal of the resistor 180 is connected to the second supply line 126 and a second terminal of the resistor 180 is connected to node 186 which provides the output of the slew rate detector circuit 102 where the ESD detection signal 104 is generated. A first plate of the capacitor 182 is connected to node 186 and a second plate of the capacitor 182 is connected to the first supply line 124. An n-channel MOSFET device 184 has its source and drain terminals connected to the second supply line 126 and its gate terminal connected to node 186. The n-channel MOSFET device 184 is accordingly connected to form a MOSFET capacitor. A diode 188 has its anode terminal connected to node 186 and its cathode terminal connected to the first supply line 124.

The slew rate detector circuit 102 operates as an RC based transient detection circuit. One function performed by this circuit 102 is as a power supply slew rate detector that fires the clamping circuit in response to slew rate that is typical of an ESD event, while holding the clamping circuits off for all slew rates at the power supply lower than the target ESD detection limit. Another function performed by the circuit 102 is to operate, once fired in response to a detected ESD event, so as to hold the clamping transistor in the on state for a period of time sufficient to fully dissipate the ESD pulse. The diode 188 is present for (charged device model) CDM purposes, and may be an optional component in some implementations of the circuit 100. The transistor 184, configured as a capacitor, is present in the circuit 100 to fine tune the circuit design, and may be an optional component in some implementations of the circuit 100.

The power supply clamp circuit 100 of FIG. 3 operates as follows in turn on: a) the slew rate detector circuit 102 senses a fast transient at or between the first and second supply lines 124 and 126 and causes the voltage at node 186 to rise asserting the ESD detection signal 104; b) the rising voltage at node 186 will eventually exceed the turn on voltage of n-channel MOSFET device 162; c) when n-channel MOSFET device 162 turns on, the input to inverter circuit 160 transitions to the voltage at the second supply line 126, and the pull-up transistor within the inverter circuit 160 is turned on; d) the output of the inverter circuit 160 then rises to the voltage at the first supply line 124 asserting the drive signal 110; e) the transistor switching circuit 122 is then actuated by the drive signal 110 to clamp the first and second supply lines 124 and 126.

In response to the clamping action on the first and second supply lines 124 and 126, the voltage at the first supply line 124 (as supplied by an external voltage source, for example) may collapse. The supply independent current source circuit 116 is powered from the first supply line 124. The collapsing supply voltage, however, is not a concern as the generated bias current 108, while PTAT, is supply independent. Thus, the supply independent current source circuit 116 will continue to generate a voltage independent current that is mirrored by the p-channel MOSFET device 164 in the pre-driver circuit 106 to source the bias current Ibias even in the collapsed supply voltage condition.

The resistor 150 is provided to hold node 146 to ground during start up. Consider operation of the circuit during power on in the absence of resistor 150. As the supply voltage ramps up, the devices of the circuit pass through the sub-threshold region before turning fully on. When the circuit operates in the sub-threshold region, the voltage at node 166 is determined by the leakage balance between transistor 164 and transistor 162. This leakage balance can vary widely dependent on process. Thus, the inverter 160 in response to the voltage at node 166 may inadvertently drive node 146 high. This operation, however, is precluded with resistor 150 present.

The power supply clamp circuit 100 of FIG. 3 will further operate as follows in turn off: a) when the detected fast transient has ended, the ESD detection signal 104 is deasserted and the n-channel MOSFET device 162 will no longer drive the input 166 of the inverter circuit 160 to the second supply line 126; b) the voltage independent current is mirrored by the p-channel MOSFET device 164 and sourced as the bias current Ibias to the input 166 of the inverter circuit 160; c) in response to the bias current Ibias, the voltage at the inverter input 166 will rise, and the pull-down transistor within the inverter circuit 160 is turned on; d) the output of the inverter circuit 160 then falls to the voltage at the second supply line 126 and the drive signal 110 is deasserted; e) the transistor switching circuit 122 is then deactuated to release the clamp of the first and second supply lines 124 and 126. The time out period is dependent on the strength of the p-channel MOSFET device 164.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An electrostatic discharge (ESD) protection circuit, comprising:
    a first power supply line;
    a second power supply line;
    a switching circuit having a first conduction terminal connected to the first power supply line, a second conduction terminal connected to the second power supply line and a gate control terminal;
    a trigger circuit for asserting, in response to detection of an ESD event at one or more of the first and second power supply lines, a trigger signal at the gate terminal of the switching circuit; and
    a voltage independent current generator circuit powered from the first and second power supply lines to generate a bias current that controls deasserting of the trigger signal;
    wherein the trigger circuit comprises:
        a resistive-capacitive ESD detection circuit configured to assert an ESD detection signal in response to the ESD event; and
        a MOSFET capacitor coupled in parallel with a resistor of the resistive-capacitive ESD detection circuit.

2. The circuit of claim 1, further comprising a functional circuit electrically coupled for power supply to the first and second power supply lines.

3. The circuit of claim 1, wherein the switching circuit is a MOSFET device and the first conduction terminal of the switching circuit is a drain terminal connected to the first power supply line and the second conduction terminal is a source terminal connected to the first power supply line.

4. The circuit of claim 1, wherein the trigger circuit further comprises a diode coupled in parallel with a capacitor of the resistive-capacitive ESD detection circuit.

5. An electrostatic discharge (ESD) protection circuit, comprising:
    a first power supply line;
    a second power supply line;
    a switching circuit having a first conduction terminal connected to the first power supply line, a second conduction terminal connected to the second power supply line and a gate control terminal;
    a trigger circuit for asserting, in response to detection of an ESD event at one or more of the first and second power supply lines, a trigger signal at the gate terminal of the switching circuit; and
    a voltage independent current generator circuit powered from the first and second power supply lines to generate a bias current that controls deasserting of the trigger signal;
    wherein the trigger circuit comprises:
        an ESD detection circuit configured to assert an ESD detection signal in response to the ESD event;

an inverter circuit having an input and having an output generating the trigger signal;
a first transistor having a source-drain path connected between the input of the inverter circuit and the second power supply line and a control gate coupled to receive the ESD detection signal; and
a second transistor having a source-drain path connected between the input of the inverter circuit and the first power supply line and a control gate coupled to an output of the voltage independent current generator circuit.

6. The circuit of claim 5, wherein the bias current is output from the source-drain path of the second transistor.

7. The circuit of claim 5, wherein the ESD detection circuit comprises a diode coupled in parallel with a capacitor between the first supply line and an output generating the ESD detection signal and a MOSFET capacitor coupled in parallel with a resistor between the second supply line and the output generating the ESD detection signal.

8. The circuit of claim 1, further comprising a resistor having a first terminal connected to the gate control terminal of the switching circuit and a second terminal connected to the second power supply line.

9. The circuit of claim 1, wherein the voltage independent current generator circuit is proportional to absolute temperature (PTAT) current generator circuit.

10. An electrostatic discharge (ESD) protection circuit, comprising:
a first power supply line;
a second power supply line;
a switching circuit having a first conduction terminal connected to the first power supply line, a second conduction terminal connected to the second power supply line and a gate control terminal;
a trigger circuit for asserting, in response to detection of an ESD event at one or more of the first and second power supply lines, a trigger signal at the gate terminal of the switching circuit; and
a voltage independent current generator circuit powered from the first and second power supply lines to generate a bias current that controls deasserting of the trigger signal;
wherein the trigger circuit comprises:
an ESD detection circuit configured to assert an ESD detection signal in response to the ESD event;
a first transistor having a source-drain path connected between a node and the second power supply line and a control gate coupled to receive the ESD detection signal; and
a second transistor having a source-drain path connected between the node and the first power supply line and a control gate coupled to an output of the voltage independent current generator circuit;
wherein the trigger signal is generated in response to a voltage at said node.

11. The circuit of claim 10, wherein the bias current is output from the source-drain path of the second transistor.

12. The circuit of claim 10, wherein the ESD detection circuit comprises a diode coupled in parallel with a capacitor between the first supply line and an output generating the ESD detection signal.

13. The circuit of claim 10, wherein the ESD detection circuit comprises a MOSFET capacitor coupled in parallel with a resistor between the second supply line and the output generating the ESD detection signal.

14. An electrostatic discharge (ESD) protection circuit, comprising:
a first power supply line;
a second power supply line;
a switching circuit having a first conduction terminal connected to the first power supply line, a second conduction terminal connected to the second power supply line and a gate control terminal;
an inverter circuit having an output connected to the gate control terminal of the switching circuit;
a first transistor having a source-drain path connected between a input of the inverter circuit and the second power supply line and a control gate coupled to receive an ESD detection signal;
a second transistor having a source-drain path connected between the input of the inverter circuit and the first power supply line and a control gate coupled to receive a bias current control signal;
an ESD detection circuit configured to assert the ESD detection signal in response to detection of an ESD event; and
a voltage independent current generator circuit powered from the first and second power supply lines and configured to generate the bias current control signal.

15. The circuit of claim 14, further comprising a functional circuit electrically coupled for power supply to the first and second power supply lines.

16. The circuit of claim 14, wherein the switching circuit is a MOSFET device and the first conduction terminal of the switching circuit is a drain terminal connected to the first power supply line and the second conduction terminal is a source terminal connected to the first power supply line.

17. The circuit of claim 14, wherein the ESD detection circuit comprises:
a capacitor between the first power supply line the control gate of the first transistor; and
a resistor between the second power supply line the control gate of the first transistor.

18. The circuit of claim 17, wherein the ESD detection circuit further comprises a diode coupled in parallel with the capacitor.

19. The circuit of claim 17, wherein the ESD detection circuit further comprises a MOSFET capacitor coupled in parallel with the resistor.

20. The circuit of claim 14, further comprising a resistor having a first terminal connected to the gate control terminal of the switching circuit and a second terminal connected to the second power supply line.

21. The circuit of claim 14, wherein the voltage independent current generator circuit is proportional to absolute temperature (PTAT) current generator circuit.

22. The circuit of claim 5, further comprising a functional circuit electrically coupled for power supply to the first and second power supply lines.

23. The circuit of claim 5, wherein the switching circuit is a MOSFET device and the first conduction terminal of the switching circuit is a drain terminal connected to the first power supply line and the second conduction terminal is a source terminal connected to the first power supply line.

24. The circuit of claim 5, wherein the trigger circuit comprises a resistive-capacitive ESD detection circuit configured to assert an ESD detection signal in response to the ESD event.

25. The circuit of claim 5, further comprising a resistor having a first terminal connected to the gate control terminal of the switching circuit and a second terminal connected to the second power supply line.

26. The circuit of claim 5, wherein the voltage independent current generator circuit is proportional to absolute temperature (PTAT) current generator circuit.

27. The circuit of claim 10, further comprising a functional circuit electrically coupled for power supply to the first and second power supply lines.

28. The circuit of claim 10, wherein the switching circuit is a MOSFET device and the first conduction terminal of the switching circuit is a drain terminal connected to the first power supply line and the second conduction terminal is a source terminal connected to the first power supply line.

29. The circuit of claim 10, wherein the trigger circuit comprises a resistive-capacitive ESD detection circuit configured to assert an ESD detection signal in response to the ESD event.

30. The circuit of claim 10, further comprising a resistor having a first terminal connected to the gate control terminal of the switching circuit and a second terminal connected to the second power supply line.

31. The circuit of claim 10, wherein the voltage independent current generator circuit is proportional to absolute temperature (PTAT) current generator circuit.

* * * * *